(12) United States Patent
Chen et al.

(10) Patent No.: US 11,450,461 B2
(45) Date of Patent: Sep. 20, 2022

(54) ELECTRONIC DEVICE

(71) Applicant: CYNTEC CO., LTD., Hsinchu (TW)

(72) Inventors: Sen-Huei Chen, Yunlin County (TW); Chi-Cheng Ma, Pingtung County (TW)

(73) Assignee: CYNTEC CO., LTD., Hsinchu (TW)

( * ) Notice: Subject to any disclaimer, the term of this patent is extended or adjusted under 35 U.S.C. 154(b) by 365 days.

(21) Appl. No.: 16/820,992

(22) Filed: Mar. 17, 2020

(65) Prior Publication Data

US 2020/0305284 A1  Sep. 24, 2020

Related U.S. Application Data

(60) Provisional application No. 62/822,051, filed on Mar. 22, 2019.

(51) Int. Cl.
| | |
|---|---|
| *H05K 1/18* | (2006.01) |
| *H01F 5/06* | (2006.01) |
| *H01F 5/04* | (2006.01) |
| *H05K 1/11* | (2006.01) |
| *H01F 41/063* | (2016.01) |
| *H01F 41/076* | (2016.01) |
| *H01F 27/06* | (2006.01) |

(52) U.S. Cl.
CPC ............ *H01F 5/06* (2013.01); *H01F 5/04* (2013.01); *H01F 27/06* (2013.01); *H01F 41/063* (2016.01); *H01F 41/076* (2016.01); *H05K 1/118* (2013.01); *H05K 1/182* (2013.01); *H01F 2027/065* (2013.01); *H05K 1/112* (2013.01); *H05K 2201/1003* (2013.01)

(58) Field of Classification Search
CPC ................ H05K 1/182; H05K 2201/1003
See application file for complete search history.

(56) References Cited

U.S. PATENT DOCUMENTS

| 4,109,296 A * | 8/1978 | Rostek ................ H05K 1/184 |
| --- | --- | --- |
| | | 361/306.1 |
| 2008/0112139 A1* | 5/2008 | Vinciarelli ............ H05K 1/141 |
| | | 361/709 |
| 2010/0156584 A1* | 6/2010 | Yamaguchi ........... H01F 27/306 |
| | | 336/65 |
| 2013/0229250 A1* | 9/2013 | Chang .................. H01F 17/043 |
| | | 336/83 |
| 2014/0266555 A1* | 9/2014 | Krishnamoorthy ..... H01F 3/10 |
| | | 336/216 |
| 2015/0170820 A1* | 6/2015 | Kadir ................... H01F 27/306 |
| | | 29/606 |
| 2016/0043569 A1* | 2/2016 | Dally .................. H01F 27/2823 |
| | | 307/104 |

* cited by examiner

*Primary Examiner* — Sherman Ng
(74) *Attorney, Agent, or Firm* — Min-Lee Teng; Litron Patent & Trademark Office

(57) ABSTRACT

An electronic device comprising: a body having a first portion and a second portion located below the first portion, wherein a bottom surface of the first portion and a side surface of the second portion forms an opening under the bottom surface of the first portion, wherein at least one portion of an electrode is disposed on the bottom surface of the first portion of the body, and at least one portion of the second portion of the body is disposed in an opening of a circuit board with the electrode being disposed on and electrically connected with the circuit board.

20 Claims, 12 Drawing Sheets

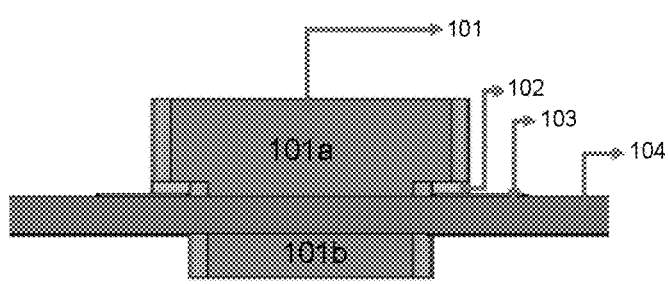
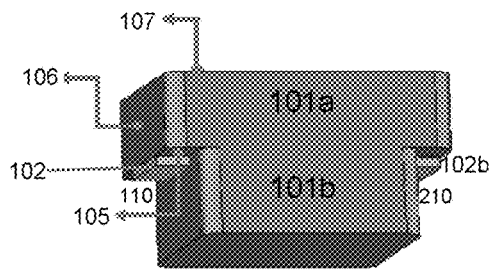
FIG. 1B
FIG. 1A
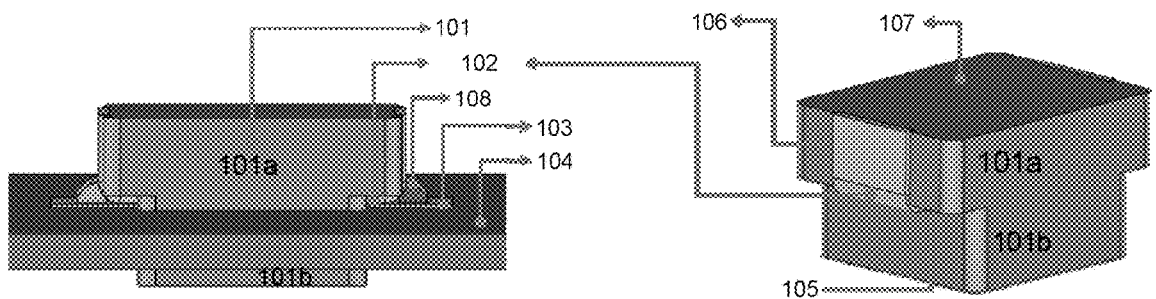
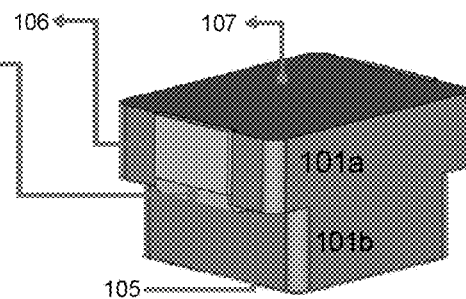
FIG. 2B
FIG. 2A

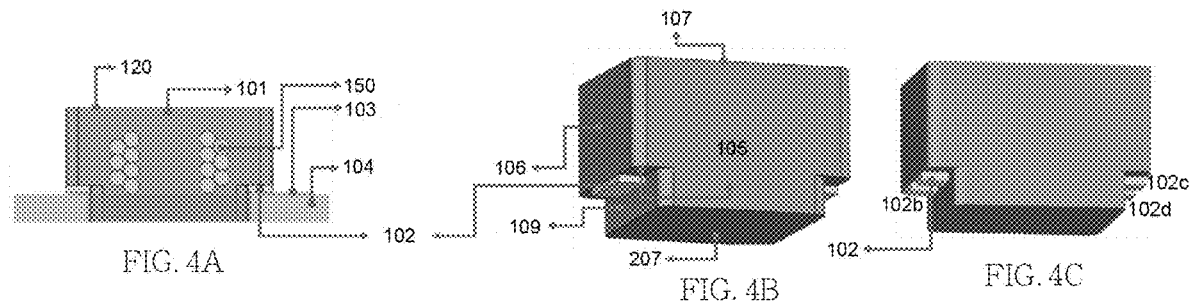
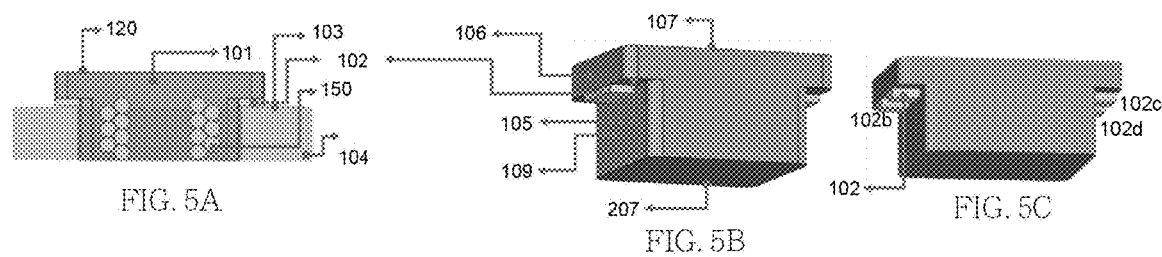

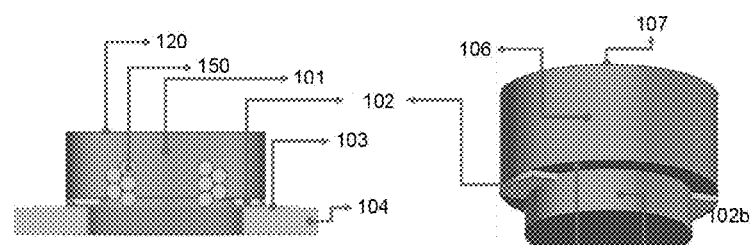
FIG. 6A
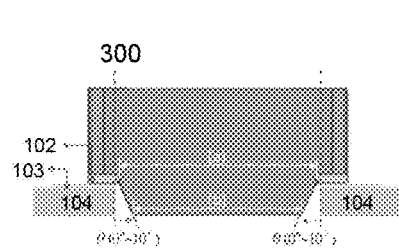
FIG. 6B
FIG. 6C
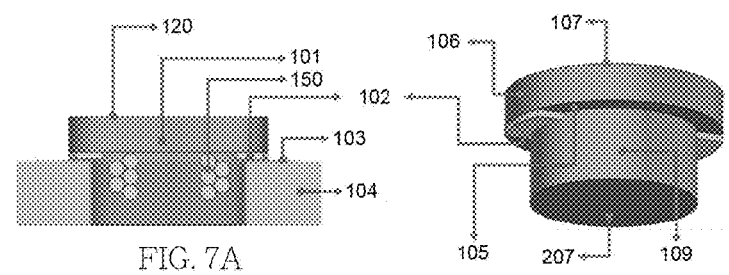
FIG. 7A
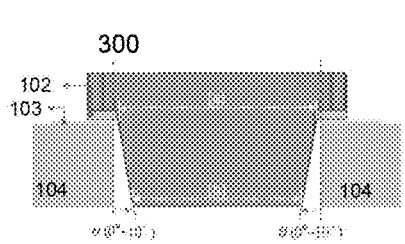
FIG. 7B
FIG. 7C
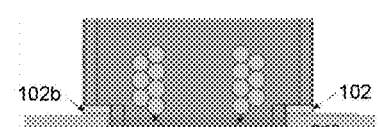
FIG. 8A
FIG. 9A
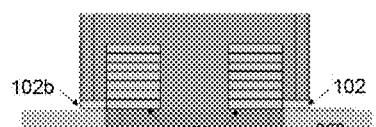
FIG. 10A
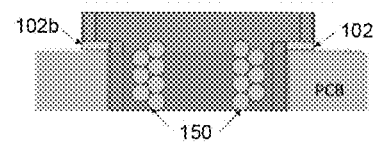
FIG. 8B
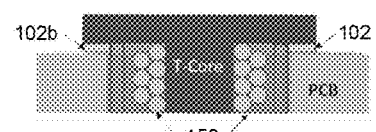
FIG. 9B
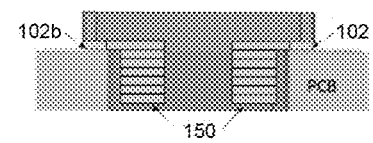
FIG. 10B

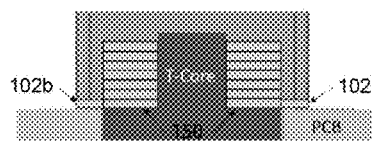 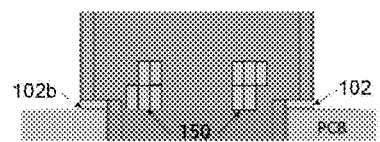 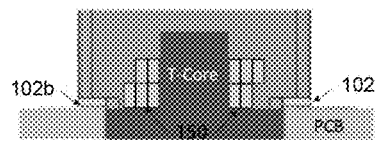
FIG. 11A  FIG. 12A  FIG. 13A
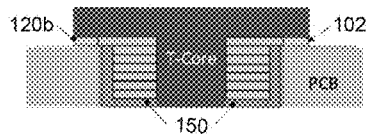 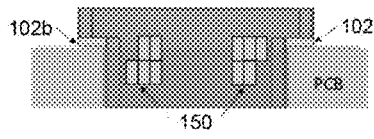 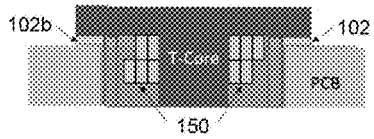
FIG. 11B  FIG. 12B  FIG. 13B

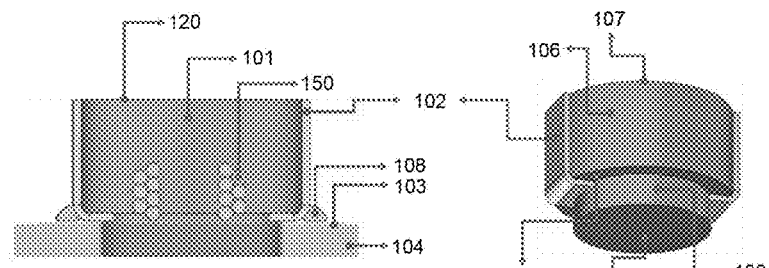
FIG. 16A
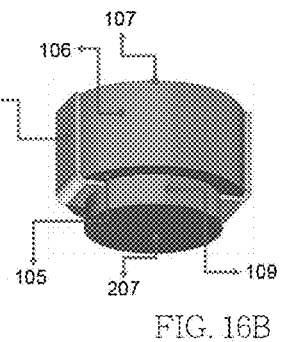
FIG. 16B
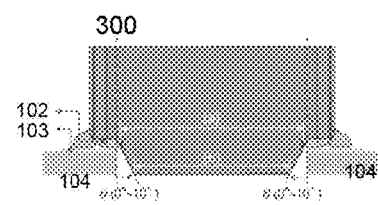
FIG. 16C
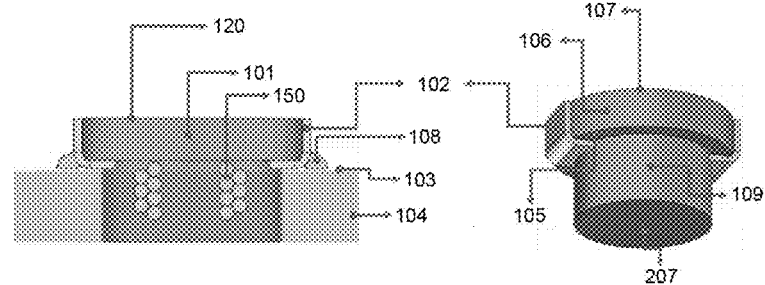
FIG. 17A
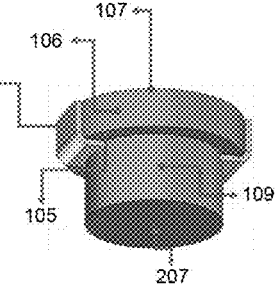
FIG. 17B
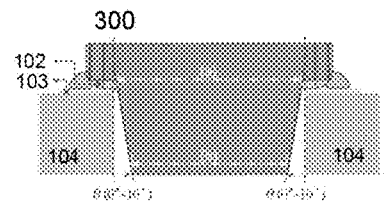
FIG. 17C
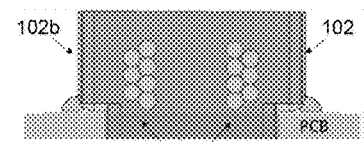
FIG. 18A
FIG. 19A
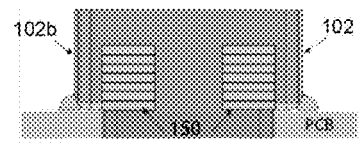
FIG. 20A
FIG. 18B
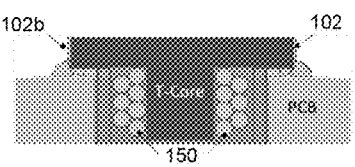
FIG. 19B
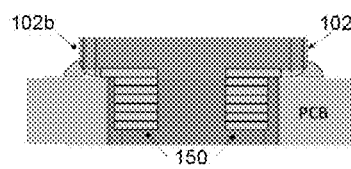
FIG. 20B

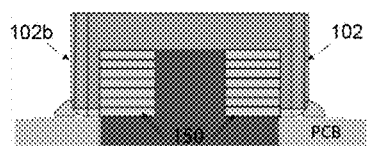 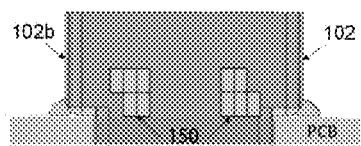 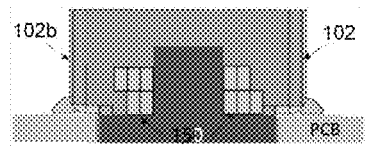
FIG. 21A　　　　　　　FIG. 22A　　　　　　　FIG. 23A
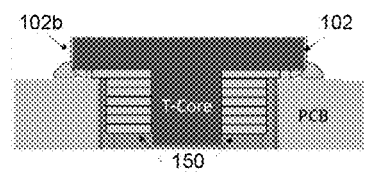 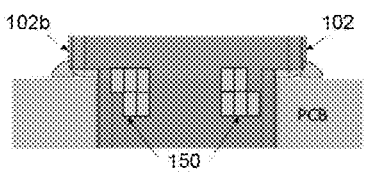 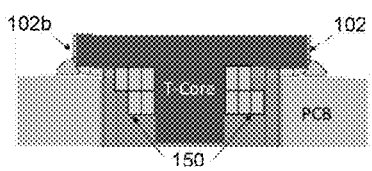
FIG. 21B　　　　　　　FIG. 22B　　　　　　　FIG. 23B

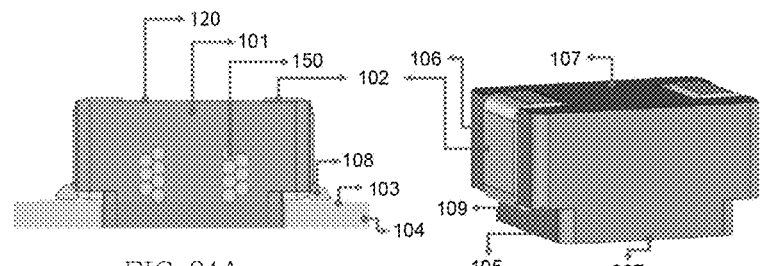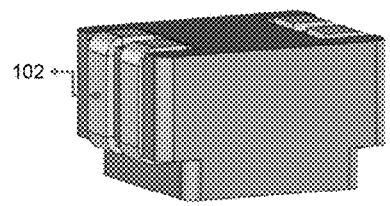
FIG. 24A  FIG. 24B  FIG. 24C
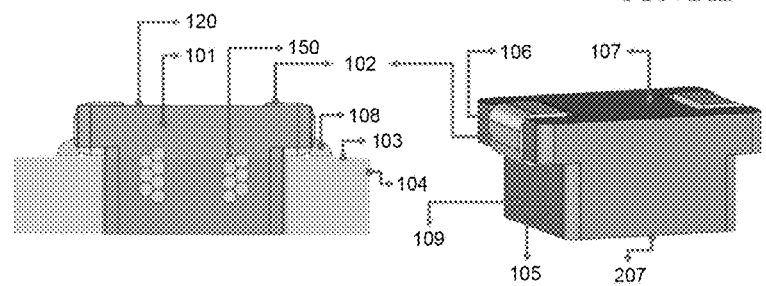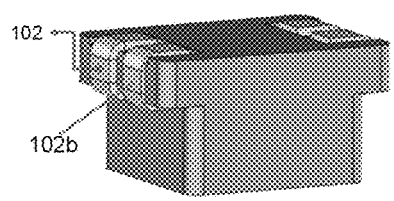
FIG. 25A  FIG. 25B  FIG. 25C
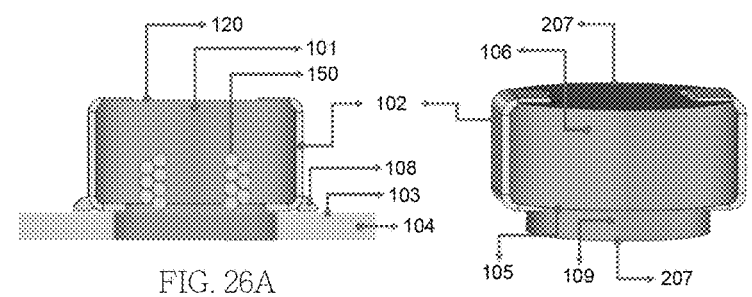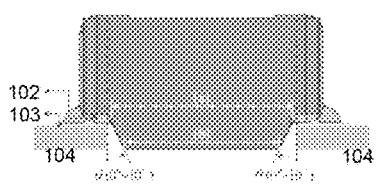
FIG. 26A  FIG. 26B  FIG. 26C
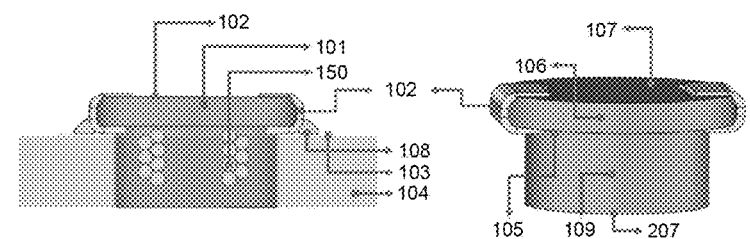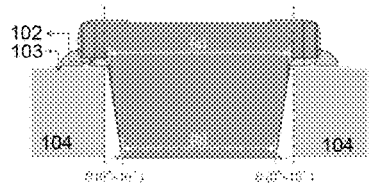
FIG. 27A  FIG. 27B  FIG. 27C

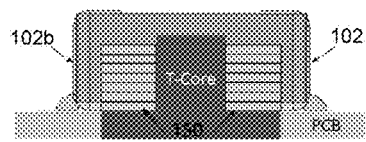 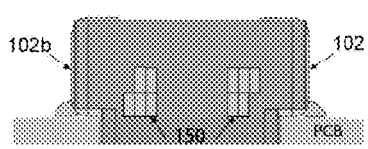 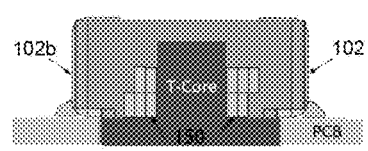
FIG. 31A    FIG. 32A    FIG. 33A
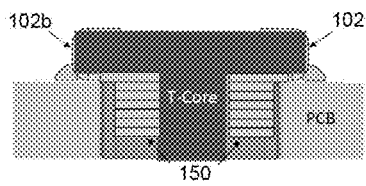 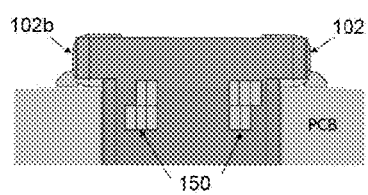 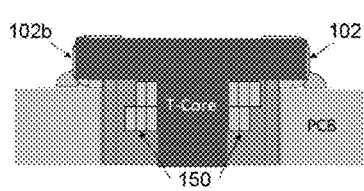
FIG. 31B    FIG. 32B    FIG. 33B

ELECTRONIC DEVICE

CROSS-REFERENCE TO RELATED APPLICATION

The present application claims the benefit of U.S. Provisional Application Ser. No. 62/822,051 filed on Mar. 22, 2019, which is hereby incorporated by reference herein and made a part of the specification.

BACKGROUND OF THE INVENTION

I. Field of the Invention

The present invention relates to an electronic device, and in particular, to an electronic device with electrodes connecting with a circuit board.

II. Description of Related Art

As the electronic devices or electronic modules becomes smaller and smaller, the reliability of the connectivity between the electrodes of an electronic device and a substrate in an electronic module needs to be high so as to prevent the connectivity from breaking, especially in a vibration environment, such as in a moving vehicle.

Therefore, how to improve the reliability of the connectivity between the electrodes of an electronic device and a substrate while reducing the overall size of the electronic module becomes an important issue.

SUMMARY OF THE INVENTION

One objective of the present invention is to provide an electronic device with a body structure to place its electrodes in openings formed along the periphery of the body, so as to improve the reliability of the connectivity between the electrodes of the electronic device and a substrate.

One objective of the present invention is to provide an electronic device with a body structure to place its electrodes in openings formed along the periphery of the body to reduce the overall size thereof.

In one embodiment of the present invention, an electronic device is disclosed, wherein the electronic device comprises: a body, comprising a first portion and a second portion, wherein the first portion is located above the second portion, wherein a first bottom surface of the first portion and a first side surface of the second portion forms a first opening under the first bottom surface of the first portion; and a first electrode, wherein at least one portion of the first electrode is disposed on the first bottom surface of the first portion, wherein at least one portion of the second portion of the body is disposed in an opening of a circuit board with the first electrode being disposed on and electrically connected with the circuit board.

In one embodiment, a ratio of the area of the bottom surface of the first electrode to the area of the bottom surface of the second portion of the magnetic body is 1:5.3~32 for allowing the vibration resistance of the inductor being greater than 5G.

In one embodiment, an insulating layer is disposed on the magnetic body for isolating with the circuit board.

In one embodiment, a second bottom surface of the first portion and a second side surface of the second portion forms a second opening under the second bottom surface of the first portion, at least one portion of a second electrode is disposed on the second bottom surface of the first portion and electrically connected with the circuit board.

In one embodiment, said opening of a circuit board is a recess on the top surface of the circuit board with a bottom surface of the second portion of the body being above a bottom surface of the circuit board.

In one embodiment, said opening of a circuit board is a through-hole of the circuit board.

In one embodiment the second portion of the body is disposed in said through-hole of the circuit board with a bottom surface of the second portion of the body being below a bottom surface of the circuit board.

In one embodiment, the second portion of the body is disposed in said through-hole of the circuit board with a bottom surface of the second portion of the body being aligned with a bottom surface of the circuit board.

In one embodiment, a first portion of the first electrode is disposed on the first bottom surface of the first portion of the body and a second portion of the first electrode is disposed on a first lateral surface of the first portion of the body, wherein a soldering material is overlaid on a top surface of the circuit board and extended to the second portion of the first electrode disposed on the first lateral surface of the first portion of the body.

In one embodiment, a first portion of the first electrode is disposed on the first bottom surface of the first portion of the body, a second portion of the first electrode is disposed on a first lateral surface of the first portion of the body, and a third portion of the first electrode is disposed on a top surface of the first portion of the body, wherein a soldering material is overlaid on a top surface of the circuit board and extended to the second portion of the first electrode disposed on the first lateral surface of the first portion of the body.

In one embodiment, a first portion of the second electrode is disposed on the second bottom surface of the first portion of the body and a second portion of the second electrode is disposed on a second lateral surface of the first portion of the body, wherein a soldering material is overlaid on a top surface of the circuit board and extended to the second portion of the second electrode disposed on the second lateral surface of the first portion of the body.

In one embodiment, a first portion of the second electrode is disposed on the second bottom surface of the first portion of the body, a second portion of the second electrode is disposed on a second lateral surface of the first portion of the body, and a third portion of the second electrode is disposed on a top surface of the first portion of the body, wherein a soldering material is overlaid on a top surface of the circuit board and extended to the second portion of the second electrode disposed on the second lateral surface of the first portion of the body.

In one embodiment, the bottom surface of the first portion has a rectangular shape or a circular shape.

In one embodiment, the first side surface of the second portion has a rectangular shape or a circular shape.

In one embodiment, at least one portion of a second electrode is disposed on the first bottom surface of the first portion and electrically connected with the circuit board, wherein a terminal of the coil is electrically connected to the first electrode and the second electrode.

In one embodiment, an inductor is disclosed, wherein the inductor comprises: a magnetic body and a coil disposed in the magnetic body, wherein the coil is formed by a conductive wire, and the magnetic body comprises a first portion and a second portion, wherein the first portion is located above the second portion, wherein a first bottom surface of the first portion and a first side surface of the second portion forms a first opening under the first bottom surface of the first portion; and a first electrode, wherein at least one portion of the first electrode is disposed on the first bottom surface of the first portion, wherein at least one portion of the second portion of the body is disposed in an opening of a circuit board with the first electrode being disposed on and electrically connected with the circuit board, wherein a terminal of the conductive wire is electrically connected to the first electrode.

In one embodiment, the magnetic body comprises a T core having a base and a pillar disposed on the base, wherein a first portion of the first electrode is disposed on a first bottom surface of the base of the T core, a second portion of the first electrode is disposed on a lateral surface of the base of the T core and a third portion of the first electrode is disposed on a top surface of the base of the T core.

In one embodiment, the first electrode is formed by a lead frame and the magnetic body comprises a T core having a base and a pillar disposed on the base, wherein a first portion of the lead frame is disposed on a first bottom surface of the base of the T core, a second portion of the lead frame is disposed on a lateral surface of the base of the T core and a third portion of the lead frame is disposed on a top surface of the base of the T core.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A depicts an enlarged cross-sectional view of an electronic device according to one embodiment of the present invention;

FIG. 1B depicts an enlarged cross-sectional view of the electronic device in FIG. 1A disposed on a circuit board according to one embodiment of the present invention;

FIG. 2A depicts an enlarged cross-sectional view of an electronic device according to one embodiment of the present invention;

FIG. 2B depicts an enlarged cross-sectional view of the electronic device in FIG. 2A disposed on a circuit board according to one embodiment of the present invention;

FIG. 4A depicts an enlarged cross-sectional view of an inductor disposed in a substrate according to one embodiment of the present invention;

FIG. 4B depicts a view of the inductor of FIG. 4A according to one embodiment of the present invention;

FIG. 4C depicts a view of the inductor of FIG. 4A according to one embodiment of the present invention;

FIG. 5A depicts an enlarged cross-sectional view of an inductor disposed in a substrate according to one embodiment of the present invention;

FIG. 5B depicts a view of the inductor of FIG. 5A according to one embodiment of the present invention;

FIG. 5C depicts a view of the inductor of FIG. 5A according to one embodiment of the present invention;

FIG. 6A depicts an enlarged cross-sectional view of an inductor disposed in a substrate according to one embodiment of the present invention;

FIG. 6B depicts a view of the inductor of FIG. 6A according to one embodiment of the present invention;

FIG. 6C depicts a view of the inductor of FIG. 6A according to one embodiment of the present invention;

FIG. 7A depicts an enlarged cross-sectional view of an inductor disposed in a substrate according to one embodiment of the present invention;

FIG. 7B depicts a view of the inductor of FIG. 7A according to one embodiment of the present invention;

FIG. 7C depicts a view of the inductor of FIG. 7A according to one embodiment of the present invention;

FIG. 8A-8B each depicts an enlarged cross-sectional view of an inductor disposed in a substrate according to one embodiment of the present invention;

FIG. 9A-9B each depicts an enlarged cross-sectional view of an inductor disposed in a substrate according to one embodiment of the present invention;

FIG. 10A-10B each depicts an enlarged cross-sectional view of an inductor disposed in a substrate according to one embodiment of the present invention;

FIG. 11A-11B each depicts an enlarged cross-sectional view of an inductor disposed in a substrate according to one embodiment of the present invention;

FIG. 12A-12B each depicts an enlarged cross-sectional view of an inductor disposed in a substrate according to one embodiment of the present invention;

FIG. 13A-13B each depicts an enlarged cross-sectional view of an inductor disposed in a substrate according to one embodiment of the present invention;

FIG. 16A depicts an enlarged cross-sectional view of an inductor disposed in a substrate according to one embodiment of the present invention;

FIG. 16B depicts a view of the inductor of FIG. 16A according to one embodiment of the present invention;

FIG. 16C depicts a view of the inductor of FIG. 16A according to one embodiment of the present invention;

FIG. 17A depicts an enlarged cross-sectional view of an inductor disposed in a substrate according to one embodiment of the present invention;

FIG. 17B depicts a view of the inductor of FIG. 17A according to one embodiment of the present invention;

FIG. 17C depicts a view of the inductor of FIG. 17A according to one embodiment of the present invention;

FIG. 18A-18B each depicts an enlarged cross-sectional view of an inductor disposed in a substrate according to one embodiment of the present invention;

FIG. 19A-19B each depicts an enlarged cross-sectional view of an inductor disposed in a substrate according to one embodiment of the present invention;

FIG. 20A-20B each depicts an enlarged cross-sectional view of an inductor disposed in a substrate according to one embodiment of the present invention;

FIG. 21A-21B each depicts an enlarged cross-sectional view of an inductor disposed in a substrate according to one embodiment of the present invention;

FIG. 22A-22B each depicts an enlarged cross-sectional view of an inductor disposed in a substrate according to one embodiment of the present invention;

FIG. 23A-23B each depicts an enlarged cross-sectional view of an inductor disposed in a substrate according to one embodiment of the present invention;

FIG. 24A depicts an enlarged cross-sectional view of an inductor disposed in a substrate according to one embodiment of the present invention;

FIG. 24B depicts a view of the inductor of FIG. 24A according to one embodiment of the present invention;

FIG. 24C depicts a view of the inductor of FIG. 24A according to one embodiment of the present invention;

FIG. 25A depicts an enlarged cross-sectional view of an inductor disposed in a substrate according to one embodiment of the present invention;

FIG. 25B depicts a view of the inductor of FIG. 25A according to one embodiment of the present invention;

FIG. 25C depicts a view of the inductor of FIG. 25A according to one embodiment of the present invention;

FIG. 26A depicts an enlarged cross-sectional view of an inductor disposed in a substrate according to one embodiment of the present invention;

FIG. 26B depicts a view of the inductor of FIG. 26A according to one embodiment of the present invention;

FIG. 26C depicts a view of the inductor of FIG. 26A according to one embodiment of the present invention;

FIG. 27A depicts an enlarged cross-sectional view of an inductor disposed in a substrate according to one embodiment of the present invention;

FIG. 27B depicts a view of the inductor of FIG. 27A according to one embodiment of the present invention;

FIG. 27C depicts a view of the inductor of FIG. 27A according to one embodiment of the present invention;

FIG. 31A-31B each depicts an enlarged cross-sectional view of an inductor disposed in a substrate according to one embodiment of the present invention;

FIG. 32A-32B each depicts an enlarged cross-sectional view of an inductor disposed in a substrate according to one embodiment of the present invention;

FIG. 33A-33B each depicts an enlarged cross-sectional view of an inductor disposed in a substrate according to one embodiment of the present invention.

DESCRIPTION OF EMBODIMENTS

Figures 3A, 3B:
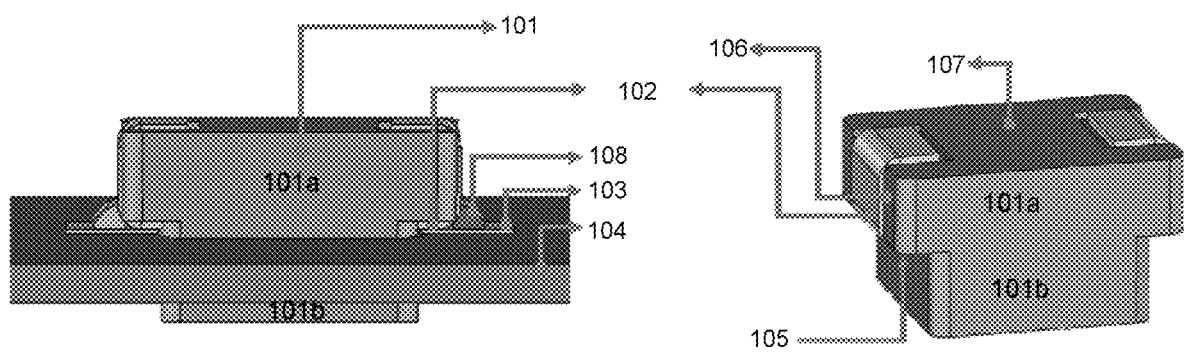
FIG. 3A depicts an enlarged cross-sectional view of an electronic device according to one embodiment of the present invention.
FIG. 3B depicts an enlarged cross-sectional view of the electronic device in FIG. 3A disposed on a circuit board according to one embodiment of the present invention.

FIG. 1A depicts an enlarged cross-sectional view of an electronic device and FIG. 1B depicts an enlarged cross-sectional view of the electronic device disposed in a circuit board, wherein the electronic device comprises: a body 101, comprising a first portion 101a and a second portion 101b, wherein the first portion 101a is located above the second portion 101b, wherein a first bottom surface 105 of the first portion 101a of the body 101 and a first side surface 109 of the second portion 101b forms a first opening 110 under the first bottom surface 105 of the first portion 101a; and a first electrode 102, wherein at least one portion of the first electrode 102 is disposed on the first bottom surface 105 of the first portion 101a, wherein at least one portion of the second portion 101b of the body 101 is disposed in an opening of a circuit board 104 with the first electrode 102 being disposed on and electrically connected with a conductive pattern 103 on the circuit board 104.

In one embodiment, a second bottom surface of the first portion 101a and a second side surface of the second portion 101b forms a second opening 210 under the second bottom surface of the first portion 101a, as shown in FIG. 1A, wherein at least one portion of a second electrode 102b is disposed on the second bottom surface of the first portion 101a, wherein the second electrode 102b being disposed on and electrically connected with the circuit board 104.

In one embodiment, the opening of the circuit board 104 is a recess on the top surface of the circuit board 104 with a bottom surface of the second portion 101b of body 101 being located above a bottom surface of the circuit board 104.

In one embodiment, said opening of the circuit board is a through-hole of the circuit board 104.

In one embodiment, the second portion 101b of the body 101 is disposed in said through-hole of the circuit board with a bottom surface of the second portion 101b of the body 101 being located below a bottom surface of the circuit board 104.

In one embodiment, the second portion 101b of the body 101 is disposed in said through-hole of the circuit board with a bottom surface of the second portion 101b of the body 101 being aligned with a bottom surface of the circuit board 104.

In one embodiment, as shown in FIG. 2A and FIG. 2B, a first portion of the first electrode 102 is disposed on the first bottom surface 105 of the first portion 101a of the body 101 and a second portion of the first electrode 102 is disposed on a first lateral surface 106 of the first portion 101a of the body 101, wherein a soldering material 108 is overlaid on a top surface of the circuit board 104 and extended to a second portion of the first electrode 102 disposed on the first lateral surface 106 of the first portion 101a of the body 101.

In one embodiment, as shown in FIG. 3A and FIG. 3B, a third portion of the first electrode 102 is disposed on a top surface 107 of the first portion 101a of the body 101.

In one embodiment, a first portion of the second electrode is disposed on the second bottom surface of the first portion 101a of the body 101 and a second portion of the second electrode is disposed on a second lateral surface of the first portion 101a of the body 101, wherein a soldering material is overlaid on a top surface of the circuit board and extended to the second portion of the second electrode disposed on the second lateral surface of the first portion 101a of the body 101.

In one embodiment, the first electrode 102 is formed by a lead frame.

In one embodiment, the first electrode 102 is formed by electro-plating.

In one embodiment, a first portion of the second electrode is disposed on the second bottom surface of the first portion of the body, a second portion of the second electrode is disposed on a second lateral surface of the first portion 101*a* of the body 101, and a third portion of the second electrode is disposed on a top surface of the first portion 101*a* of the body 101, wherein a soldering material is overlaid on a top surface of the circuit board and extended to the second portion of the second electrode disposed on the second lateral surface of the first portion 101*a* of the body 101.

In one embodiment, wherein the first side surface 109 of the second portion 101*b* has a rectangular shape.

In one embodiment, wherein the first side surface 109 of the second portion 101*b* has a circular shape.

In one embodiment, wherein the bottom surface of the first portion 101*a* of the body 101 has a rectangular shape.

In one embodiment, wherein the bottom surface of the first portion 101*a* of the body 101 has a circular shape.

In one embodiment, the body is a magnetic body, the electronic device comprises at least one coil disposed in the magnetic body.

In one embodiment, each of the first portion 101*a* and the second portion 101*b* of the body 101 has a polygon shape.

In one embodiment, the magnetic body 101 is integrally formed with a unitary body.

In one embodiment, wherein the electronic device is an inductor, as shown in FIG. 4A and FIG. 4B, wherein the body 101 is a magnetic body and a coil 150 is disposed in the magnetic body 101. In one embodiment, the coil 150 comprises a plurality of winding turns, wherein the plurality of winding turns are entirely located above the top surface of the circuit board 104, as shown in FIG. 4A. In one embodiment, as shown in FIG. 4A, the electrode 102 disposed on the first bottom surface 105 of the first portion 101*a* can be extended to an area 120 on the top surface of the first portion 101*a* of the magnetic body 101. In one embodiment, as shown in FIG. 4B, the electrode 102 is disposed on the first bottom surface 105 of the first portion 101*a* of the magnetic body 101.

In one embodiment, as shown in FIG. 4C, two electrodes 102, 102*b* are disposed on the first bottom surface 105 of the first portion 101*a* of the body 101, wherein a terminal of the coil 150 is electrically connected to said two electrodes 102, 102*b*, instead of only one electrode 102, for reliability; and the other terminal of the coil 150 can be electrically connected another two electrodes 102*c*, 102*d*.

In one embodiment, the second portion 101*b* of the body 101 is disposed in the circuit board 104 with a bottom surface 207 of the second portion 101*b* of the body 101 being aligned with a bottom surface of the circuit board 104, as shown in FIG. 4A and FIG. 5A.

In one embodiment, a ratio of the area of the bottom surface of the first electrode 102 to the area of the bottom surface 207 of the second portion 101*b* of the magnetic body 101 is 1:5.3~32 for allowing the vibration resistance of the inductor being greater than 5G.

In one embodiment, as shown in FIG. 5A and FIG. 5B, the coil 150 having a plurality of winding turns, wherein one portion of the plurality of winding turns are located above the top surface of the circuit board 104, and the other portion of the plurality of winding turns are located below the top surface of the circuit board 104, wherein the electrode 102 is disposed on the first bottom surface 105 of the first portion 101*a* of the magnetic body 101.

In one embodiment, as shown in FIG. 5C, two electrodes 102, 102*b* are disposed on the first bottom surface 105 of the first portion 101*a* of the body 101, wherein a terminal of the coil 150 is electrically connected to the two electrodes 102, 102*b* for reliability; and the other terminal of the coil 150 can be electrically connected another two electrodes 102*c*, 102*d*.

In one embodiment, the inductor is a choke.

In one embodiment, an insulating layer is disposed on the magnetic body 101 for isolating with the circuit board 104. In one embodiment, the insulating layer comprises Epoxy. In one embodiment, the thickness of the insulating layer is 10 um~150 um, and the insulation resistance is >50V/mm to prevent the magnetic body from contacting with the PCB board for avoiding short circuits in the PCB.

In one embodiment, the coil can be formed by a round wire or a flat wire or conductive patterns formed by thick film process, thin film process or electro-plating process.

In one embodiment, the electrode is formed by flattening the terminal part of the conductive wire and disposing at least one metal layer on said flattened terminal part of the conductive wire. In one embodiment, the at least one metal layer comprises Sn.

In one embodiment, the electrode is made by an electro-plating process using at least one metal material, such as Cu, Ni and Sn, wherein a terminal of the coil 150 is electrically connected to the electrode.

In one embodiment, the electrode is made by a lead frame.

In one embodiment, each of the first portion 101*a* and the second portion 101*b* of the body 101 has a circular shape, as shown in FIG. 6A. FIG. 6B shows the magnetic body 101 with the electrode 102 disposed on the first bottom surface 105 of the first portion 101*a* of the magnetic body 101.

In one embodiment, as shown in FIG. 6A, the height of the first portion 101*a* is greater than that of the second portion 101*b* of the body 101.

In one embodiment, as shown in FIG. 6C, wherein the first bottom surface 105 of the first portion 101*a* and the first side surface 109 of the second portion 101*b* is not necessarily perpendicular to each other and the first side surface 109 and a vertical line 300 can form an angle of 0-10 degree, wherein the minimum distance (a) between the first electrode and the second electrode is greater than the width (b) of the bottom surface of the second portion of the body 101, which will help to insert the body 101 of the inductor into the opening of the circuit board 104 during a SMD process.

In one embodiment, each of the first portion 101*a* and the second portion 101*b* of the body 101 has a circular shape, as shown in FIG. 7A. FIG. 7B shows the magnetic body 101 with the electrode 102 disposed on the first bottom surface 105 of the first portion 101*a* of the magnetic body 101.

In one embodiment, as shown in FIG. 7C, wherein the first bottom surface 105 of the first portion 101*a* and the first side surface 109 of the second portion 101*b* is not necessarily perpendicular to each other and the first side surface 109 and a vertical line 300 can form an angle of 0-10 degree, wherein the minimum distance (a) between the first electrode and the second electrode is greater than the width (b) of the bottom surface of the second portion of the body 101, which will help to insert the body 101 of the inductor into the opening of the circuit board 104 during a SMD process.

In one embodiment, as shown in FIG. 6A and FIG. 8A, the height of the first portion 101*a* is greater than that of the second portion 101*b* of the body 101.

In one embodiment, as shown in FIG. 7A and FIG. 9A, the height of the first portion 101*a* is less than that of the second portion 101*b* of the body 101.

In one embodiment, as shown in FIG. 9A, the body 101 comprises a T core, wherein the base of the T core is disposed in the opening of a circuit board 104.

In one embodiment, as shown in FIG. 9B, at least one portion of the pillar of the T core is disposed in the opening of a circuit board 104.

In one embodiment, as shown in FIG. 10A and FIG. 10B, a terminal part of the conductive wire forming the coil 150 is extended to the first bottom surface 105 of the first portion 101*a* of the body 101, wherein at least one metal layer is disposed on the terminal part of the conductive wire to form the electrode 102.

In one embodiment, as shown in FIG. 11A, the body 101 comprises a T core, wherein the base of the T core is disposed in the opening of a circuit board 104, wherein a terminal part of the conductive wire forming the coil 150 is extended to the first bottom surface 105 of the first portion 101*a* of the body 101, wherein at least one metal layer is disposed on the terminal part of the conductive wire to form the electrode 102.

In one embodiment, as shown in FIG. 11B, at least one portion of the pillar of the T core is disposed in the opening of a circuit board 104, wherein a terminal part of the conductive wire forming the coil 150 is extended to the first bottom surface 105 of the first portion 101*a* of the body 101, wherein at least one metal layer is disposed on the terminal part of the conductive wire to form the electrode 102.

In one embodiment, as shown in FIG. 12A, wherein a terminal part of the conductive wire forming the coil is electrically connected to the electrode 102.

In one embodiment, as shown in FIG. 12B, wherein a terminal part of the conductive wire forming the coil 150 is electrically connected to the electrode 102.

In one embodiment, as shown in FIG. 13A, the body 101 comprises a T core, wherein the base of the T core is disposed in the opening of a circuit board 104, wherein a terminal part of the conductive wire forming the coil 150 is electrically connected to the electrode 102.

In one embodiment, as shown in FIG. 13B, at least one portion of the pillar of the T core is disposed in the opening of a circuit board 104, wherein a terminal part of the conductive wire forming the coil 150 is electrically connected to the electrode 102.

Figures 14A, 14B, 14C:
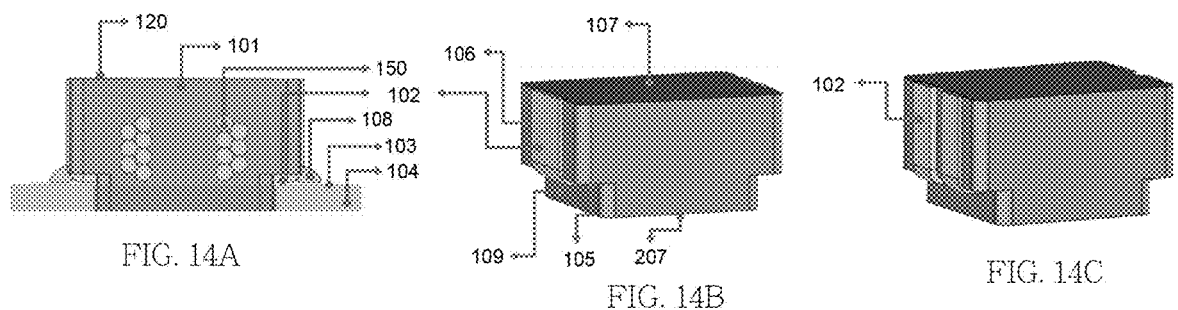
FIG. 14A depicts an enlarged cross-sectional view of an inductor disposed in a substrate according to one embodiment of the present invention.
FIG. 14B depicts a view of the inductor of FIG. 14A according to one embodiment of the present invention.
FIG. 14C depicts a view of the inductor of FIG. 14A according to one embodiment of the present invention.

In one embodiment, wherein the electronic device is an inductor, as shown in FIG. 14A, FIG. 14B, FIG. 14C, wherein two electrodes are disposed on the first bottom surface 105 of the first portion 101*a* of the body 101, wherein each electrode is extended to the side surface 106 of the first portion 101*a* of the body 101 a terminal of the coil 150 is electrically connected to the two electrodes for reliability.

Figures 15A, 15B, 15C:
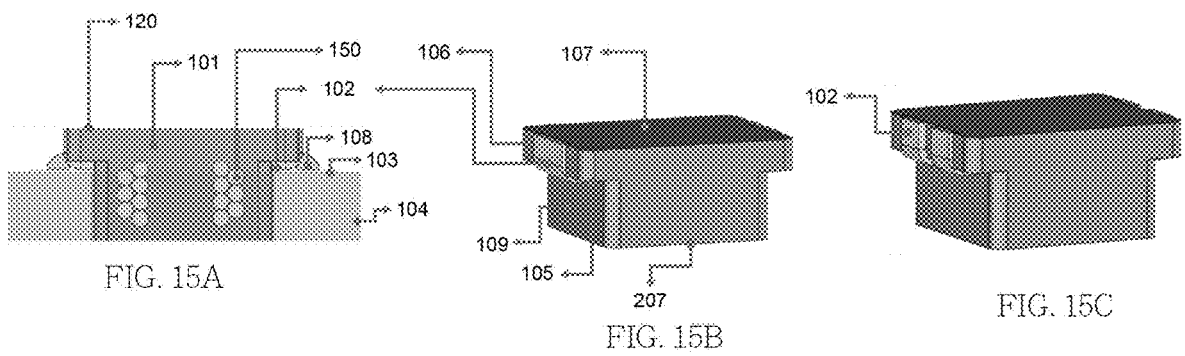
FIG. 15A depicts an enlarged cross-sectional view of an inductor disposed in a substrate according to one embodiment of the present invention.
FIG. 15B depicts a view of the inductor of FIG. 15A according to one embodiment of the present invention.
FIG. 15C depicts a view of the inductor of FIG. 15A according to one embodiment of the present invention.

In one embodiment, wherein the electronic device is an inductor, as shown in FIG. 15A, FIG. 15B, FIG. 15C, wherein two electrodes are disposed on the first bottom surface 105 of the first portion 101*a* of the body 101, wherein each electrode is extended to the side surface 106 of the first portion 101*a* of the body 101 a terminal of the coil 150 is electrically connected to the two electrodes for reliability.

In one embodiment, wherein each of the first portion 101*a* and the second portion 101*b* of the body 101 has a circular shape, as shown in FIG. 16A and FIG. 16B, wherein the electrode 102 is disposed on the first bottom surface 105 of the first portion 101*a* of the body 101, wherein the electrode 102 is extended to the side surface 106 of the first portion 101*a* of the body 101, wherein a terminal of the coil 150 is electrically connected to the two electrodes for reliability.

In one embodiment, wherein each of the first portion 101*a* and the second portion 101*b* of the body 101 has a circular shape, as shown in FIG. 17A and FIG. 17B, wherein the electrode 102 is disposed on the first bottom surface 105 of the first portion 101*a* of the body 101, wherein the electrode 102 is extended to the side surface 106 of the first portion 101*a* of the body 101, wherein a terminal of the coil 150 is electrically connected to the two electrodes for reliability.

In one embodiment, as shown in FIG. 17C, wherein the first bottom surface 105 of the first portion 101*a* and the first side surface 109 of the second portion 101*b* is not necessarily perpendicular to each other and the first side surface 109 and a vertical line 300 can form an angle of 0-10 degree, and the minimum distance (a) between the first electrode and the second electrode is greater than the width (b) of the bottom surface of the second portion of the body 101, as shown in FIG. 17C, which will help to insert the body 101 of the inductor into the opening of the circuit board 104 during a SMD process.

In one embodiment, as shown in FIG. 18A and FIG. 18B, wherein a first portion of the first electrode 102 is disposed on the first bottom surface 105 and a second portion of the first electrode 102 is disposed on a first lateral surface 106, wherein a soldering material 108 is overlaid on a top surface of the circuit board 104 and extended to the second portion of the first electrode 102 disposed on the first lateral surface 106 of the first portion 101*a* of the body 101; and a first portion of the second electrode 102*b* is disposed on the second bottom surface of the first portion 101*a* of the body 101 and a second portion of the second electrode 102*b* is disposed on a first lateral surface 106, wherein a soldering material 108 is overlaid on a top surface of the circuit board 104 and extended to the second portion of the second electrode 102*b* disposed on the second lateral surface of the first portion 101*a* of the body 101.

In one embodiment, as shown in FIG. 19A, wherein the body 101 comprises a T core, wherein the base of the T core is disposed in the opening of a circuit board 104, wherein a first portion of the first electrode 102 is disposed on the first bottom surface 105 and a second portion of the first electrode 102 is disposed on a first lateral surface 106, wherein a soldering material 108 is overlaid on a top surface of the circuit board 104 and extended to the second portion of the first electrode 102 disposed on the first lateral surface 106, wherein the first portion 101*a* of the body 101 comprises the pillar of the T core.

In one embodiment, as shown in FIG. 19B, wherein the body 101 comprises a T core, wherein the pillar of the T core is disposed in the opening of a circuit board 104, wherein a first portion of the first electrode 102 is disposed on the first bottom surface 105 and a second portion of the first electrode 102 is disposed on a first lateral surface 106, wherein a soldering material 108 is overlaid on a top surface of the circuit board 104 and extended to the second portion of the first electrode 102 disposed on the first lateral surface 106 of the first portion 101*a* of the body 101, wherein the first portion 101*a* of the body 101 comprises the base of the T core.

In one embodiment, as shown in FIG. 20A and FIG. 20B, wherein a first portion of the first electrode is disposed on the first bottom surface 105 and a second portion of the first electrode 102 is disposed on a first lateral surface 106, wherein a soldering material 108 is overlaid on a top surface of the circuit board 104 and extended to the second portion of the first electrode 102 disposed on the first lateral surface 106 of the first portion 101*a* of the body 101; and a first portion of the second electrode 102*b* is disposed on the second bottom surface of the first portion 101*a* of the body 101 and a second portion of the second electrode 102*b* is disposed on the first lateral surface 106, wherein a soldering material 108 is overlaid on a top surface of the circuit board 104 and extended to the second portion of the second electrode 102b disposed on the second lateral surface of the first portion 101a of the body 101.

In one embodiment, as shown in FIG. 21A, wherein the body 101 comprises a T core, wherein the base of the T core is disposed in the opening of a circuit board 104, wherein a first portion of the first electrode 102 is disposed on the first bottom surface 105 and a second portion of the first electrode 102 is disposed on a first lateral surface 106 of the first portion 101a of the body 101, wherein a soldering material 108 is overlaid on a top surface of the circuit board 104 and extended to the second portion of the first electrode 102 disposed on the first lateral surface 106, wherein the first portion 101a of the body 101 comprises the pillar of the T core.

In one embodiment, as shown in FIG. 21B, wherein the body 101 comprises a T core, wherein the pillar of the T core is disposed in the opening of a circuit board 104, wherein a first portion of the first electrode 102 is disposed on the first bottom surface 105 of the first portion 101a of the body 101 and a second portion of the first electrode 102 is disposed on a first lateral surface 106 of the first portion 101a of the body 101, wherein a soldering material 108 is overlaid on a top surface of the circuit board 104 and extended to the second portion of the first electrode 102 disposed on the first lateral surface 106, wherein the first portion 101a of the body 101 comprises the base of the T core.

In one embodiment, as shown in FIG. 22A, wherein a first portion of the first electrode 102 is disposed on the first bottom surface 105 and a second portion of the first electrode 102 is disposed on a first lateral surface 106, wherein a soldering material 108 is overlaid on a top surface of the circuit board 104 and extended to the second portion of the first electrode 102 disposed on the first lateral surface 106. Please note that the coil 150 can be wound in vertical direction to increase the density of the winding turns of the coil to allow the coil has a low DCR (direct current resistance), as shown in FIG. 22A.

In one embodiment, as shown in FIG. 22B, wherein a first portion of the first electrode 102 is disposed on the first bottom surface 105 and a second portion of the first electrode 102 is disposed on a first lateral surface 106, wherein a soldering material 108 is overlaid on a top surface of the circuit board 104 and extended to the second portion of the first electrode 102 disposed on the first lateral surface 106. Please note that the coil can be wound in vertical direction to increase the density of the winding turns of the coil to allow the coil has a low DCR (direct current resistance), as shown in FIG. 22B.

In one embodiment, as shown in FIG. 23A, wherein the body 101 comprises a T core, wherein the base of the T core is disposed in the opening of a circuit board 104, wherein a first portion of the first electrode 102 is disposed on the first bottom surface 105 and a second portion of the first electrode 102 is disposed on a first lateral surface 106, wherein a soldering material 108 is overlaid on a top surface of the circuit board 104 and extended to the second portion of the first electrode 102 disposed on the first lateral surface 106 of the first portion 101a of the body 101, wherein the first portion 101a of the body 101 comprises the pillar of the T core.

In one embodiment, as shown in FIG. 23B, wherein the body 101 comprises a T core, wherein the pillar of the T core is disposed in the opening of a circuit board 104, wherein a first portion of the first electrode 102 is disposed on the first bottom surface 105 of the first portion 101a of the body 101 and a second portion of the first electrode 102 is disposed on a first lateral surface 106 of the first portion 101a of the body 101, wherein a soldering material 108 is overlaid on a top surface of the circuit board 104 and extended to the second portion of the first electrode 102 disposed on the first lateral surface 106 of the first portion 101a of the body 101, wherein the first portion 101a of the body 101 comprises the base of the T core.

In one embodiment, as shown in FIG. 24C, wherein the electrode 102 is disposed on the first bottom surface 105 of the first portion 101a of the body 101, wherein each of the two electrode 102 is extended to the side surface 106 of the first portion 101a of the body 101 and the top surface 107 of the first portion 101a of the body 101, wherein a terminal of the coil 150 is electrically connected to the two electrodes for reliability.

In one embodiment, In one embodiment, as shown in FIG. 25C, wherein the electrode 102 is disposed on the first bottom surface 105 of the first portion 101a of the body 101, wherein each of the two electrode 102 is extended to the side surface 106 of the first portion 101a of the body 101 and the top surface 107 of the first portion 101a of the body 101, wherein a terminal of the coil 150 is electrically connected to the two electrodes for reliability.

In one embodiment, as shown in FIG. 24B, FIG. 24C, FIG. 25B, FIG. 25C, the electrode 102 is formed by a lead frame, wherein a first portion of the lead frame is disposed on the first bottom surface 105 of the first portion 101a of the body 101, a second portion of the lead frame is disposed on the side bottom surface 106 of the first portion 101a of the body 101, and a third portion of the lead frame is disposed on the top bottom surface 107 of the first portion 101a of the body 101, wherein a terminal of the coil 150 is electrically connected to the lead frame.

In one embodiment, as shown in FIG. 25C, the second electrode 102b is formed by a lead frame, wherein a first portion of the lead frame is disposed on the first bottom surface 105 of the first portion 101a of the body 101, a second portion of the lead frame is disposed on the side bottom surface 106 of the first portion 101a of the body 101, and a third portion of the lead frame is disposed on the top bottom surface 107 of the first portion 101a of the body 101, wherein a terminal of the coil 150 is electrically connected to the first electrode 102 formed by a first lead frame and the second electrode 102b formed by a second lead frame.

In one embodiment, wherein each of the first portion 101a and the second portion 101b of the body 101 has a circular shape, as shown in FIG. 26A and FIG. 26B, wherein the electrode 102 is disposed on the first bottom surface 105 of the first portion 101a of the body 101, wherein the electrode 102 is extended to the side surface 106 of the first portion 101a of the body 101 and to the top surface 107 of the first portion 101a of the body 101.

In one embodiment, as shown in FIG. 26C, wherein the first bottom surface 105 of the first portion 101a and the first side surface 109 of the second portion 101b is not necessarily perpendicular to each other and the first side surface 109 and a vertical line 300 can form an angle of 0-10 degree, and the minimum distance (a) between the first electrode and the second electrode is greater than the width (b) of the bottom surface of the second portion of the body 101, as shown in FIG. 26C, which will help to insert the body 101 of the inductor into the opening of the circuit board 104 during a SMD process.

In one embodiment, wherein each of the first portion 101a and the second portion 101b of the body 101 has a circular shape, as shown in FIG. 27A and FIG. 27B, wherein the electrode 102 is disposed on the first bottom surface 105 of the first portion 101a of the body 101, wherein the electrode 102 is extended to the side surface 106 of the first portion 101a of the body 101 and to the top surface 107 of the first portion 101a of the body 101.

In one embodiment, as shown in FIG. 27C, wherein the first bottom surface 105 of the first portion 101a and the first side surface 109 of the second portion 101b is not necessarily perpendicular to each other and the first side surface 109 and a vertical line 300 can form an angle of 0-10 degree, and the minimum distance (a) between the first electrode and the second electrode is greater than the width (b) of the bottom surface of the second portion of the body 101, as shown in FIG. 27C, which will help to insert the body 101 of the inductor into the opening of the circuit board 104 during a SMD process.

Figure 28A:
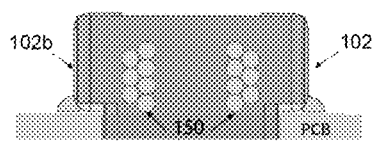
FIG. 28A-28B each depicts an enlarged cross-sectional view of an inductor disposed in a substrate according to one embodiment of the present invention.

In one embodiment, as shown in FIG. 28A, wherein a first portion of the first electrode is disposed on the first bottom surface 105 and a second portion of the first electrode 102 is disposed on a first lateral surface 106, and a third portion of the first electrode 102 is disposed on the top surface 107 of the first portion 101a of the body 101, wherein a soldering material 108 is overlaid on a top surface of the circuit board 104 and extended to the second portion of the first electrode 102 disposed on the first lateral surface 106 of the first portion 101a of the body 101.

Figure 28B:
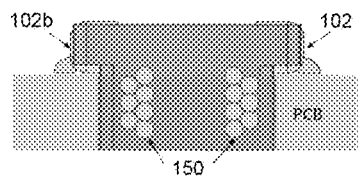

In one embodiment, as shown in FIG. 28B, wherein the pillar of the T core is disposed in the opening of a circuit board 104, wherein a first portion of the first electrode 102 is disposed on the first bottom surface 105 and a second portion of the first electrode 102 is disposed on a first lateral surface 106 and a third portion of the first electrode 102 is disposed on the top surface 107 of the first portion 101a of the body 101, wherein a soldering material 108 is overlaid on a top surface of the circuit board 104 and extended to the second portion of the first electrode 102 disposed on the first lateral surface 106 of the first portion 101a of the body 101.

Figure 29A:
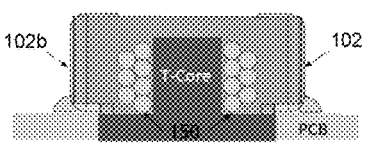
FIG. 29A-29B each depicts an enlarged cross-sectional view of an inductor disposed in a substrate according to one embodiment of the present invention.

In one embodiment, as shown in FIG. 29A, the first portion 101a of the body 101 comprises the pillar of the T core.

Figure 29B:
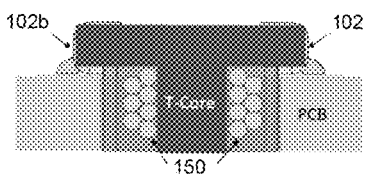

In one embodiment, as shown in FIG. 29B, the body 101 comprises a T core, wherein the pillar of the T core is disposed in the opening of a circuit board 104, and the first portion 101a of the body 101 comprises the base of the T core.

Figure 30A:
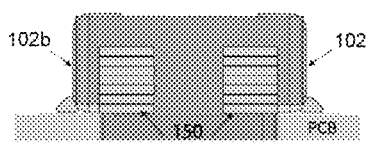
FIG. 30A-30B each depicts an enlarged cross-sectional view of an inductor disposed in a substrate according to one embodiment of the present invention.
Figure 30B:
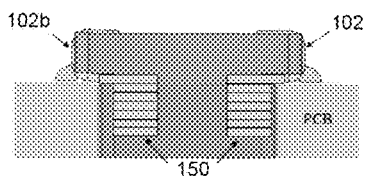

In one embodiment, as shown in FIGS. 30A and 30B, the magnetic body 101 does not include a T core, and a terminal of the coil 150 can be extended and disposed onto the bottom surface 105, and at least one metal layer can be overlaid on the terminal of the coil. In one embodiment, the magnetic body 101 is integrally formed with a unitary body.

In one embodiment, as shown in FIG. 31A, the body 101 comprises a T core, wherein the base of the T core is disposed in the opening of a circuit board 104, wherein a first portion of the first electrode is disposed on the first bottom surface 105 of the first portion 101a of the body 101 and a second portion of the first electrode 102 is disposed on a first lateral surface 106 of the first portion 101a of the body 101, and a third portion of the first electrode 102 is disposed on the top surface of the first portion 101a of the body 101, wherein a soldering material 108 is overlaid on a top surface of the circuit board 104 and extended to the second portion of the first electrode 102 disposed on the first lateral surface 106 of the first portion 101a of the body 101, wherein the first portion 101a of the body 101 comprises the pillar of the T core.

In one embodiment, as shown in FIG. 31B, the body 101 comprises a T core, wherein the pillar of the T core is disposed in the opening of a circuit board 104.

In one embodiment, as shown in FIGS. 32A and 32B, a first portion of the first electrode is disposed on the first bottom surface 105 of the first portion 101a of the body 101 and a second portion of the first electrode 102 is disposed on a first lateral surface 106 of the first portion 101a of the body 101, and a third portion of the first electrode 102 is disposed on the top surface of the first portion 101a of the body 101, wherein a soldering material 108 is overlaid on a top surface of the circuit board 104 and extended to the second portion of the first electrode 102 disposed on the first lateral surface 106 of the first portion 101a of the body 101.

In one embodiment, as shown in FIG. 33A, the magnetic body 101 comprises a T core, wherein the base of the T core is disposed in the opening of a circuit board 104, wherein a first portion of the first electrode 102 is disposed on the first bottom surface 105 of the first portion 101a of the magnetic body 101 and a second portion of the first electrode 102 is disposed on a first lateral surface 106 of the first portion 101a of the body 101, and a third portion of the first electrode 102 is disposed on the top surface 120 of the first portion 101a of the body 101, wherein a soldering material 108 is overlaid on a top surface of the circuit board 104 and extended to the second portion of the first electrode 102 disposed on the first lateral surface 106 of the first portion 101a of the magnetic body 101, wherein the first portion 101a of the magnetic body 101 comprises the pillar of the T core.

In one embodiment, as shown in FIG. 33B, the magnetic body 101 comprises a T core, wherein the pillar of the T core is disposed in the opening of a circuit board 104, wherein a first portion of the first electrode is disposed on the first bottom surface 105 of the first portion 101a of the magnetic body 101 and a second portion of the first electrode 102 is disposed on a first lateral surface 106 of the first portion 101a of the magnetic body 101 and a third portion of the first electrode 102 is disposed on the top surface 120 of the first portion 101a of the magnetic body 101, wherein a soldering material 108 is overlaid on a top surface of the circuit board 104 and extended to the second portion of the first electrode 102 disposed on the first lateral surface 106 of the first portion 101a of the magnetic body 101, wherein the first portion 101a of the body 101 comprises the base of the T core.

Figure 34A:
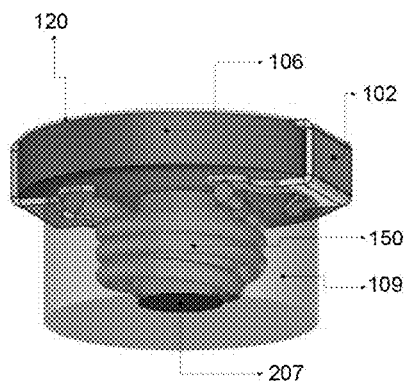
FIG. 34A-34C each depicts a top view of an inductor disposed in a substrate according to one embodiment of the present invention.

In one embodiment, as shown in FIG. 34A, the magnetic body 101 comprises a T core and a coil wound around the pillar of the T core, wherein the magnetic body 101 comprises a magnetic molding body to encapsulate the pillar of the T core with at least one portion of pillar disposed in the opening of a circuit board 104, wherein a first portion of the first electrode 102 is disposed on the first bottom surface 105 of the first portion 101a of the magnetic body 101, wherein a terminal of the conductive wire forming the coil 150 can be disposed on the first portion of the first electrode 102, and a second portion of the first electrode 102 is disposed on a first lateral surface 106 of the first portion 101a of the magnetic body 101 and a third portion of the first electrode 102 is disposed on the top surface 120 of the first portion 101a of the magnetic body 101, wherein a soldering material 108 can be overlaid on a top surface of the circuit board 104 and extended to the second portion of the first electrode 102 disposed on the first lateral surface 106 of the first portion 101a of the magnetic body 101, wherein the first portion 101a of the body 101 comprises the base of the T core. In one embodiment, the first electrode 102 is a lead frame.

Figure 34B:
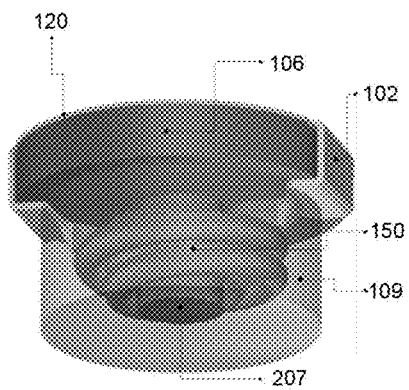

In one embodiment, as shown in FIG. 34B, the magnetic body 101 comprises a T core and a coil wound around the pillar of the T core, wherein the magnetic body 101 comprises a magnetic molding body to encapsulate the pillar of the T core with at least one portion of pillar disposed in the opening of a circuit board 104, wherein a first portion of the first electrode 102 is disposed on the first bottom surface 105 of the first portion 101a of the magnetic body 101, wherein a terminal of the conductive wire forming the coil 150 can be soldered to the first portion of the first electrode 102, and a second portion of the first electrode 102 is disposed on a first lateral surface 106 of the first portion 101a of the magnetic body 101 and a third portion of the first electrode 102 is disposed on the top surface 120 of the first portion 101a of the magnetic body 101, wherein a soldering material 108 is overlaid on a top surface of the circuit board 104 and extended to the second portion of the first electrode 102 disposed on the first lateral surface 106 of the first portion 101a of the magnetic body 101, wherein the first portion 101a of the magnetic body 101 comprises the base of the T core. In one embodiment, the first electrode is formed by a lead frame.

Figure 34C:
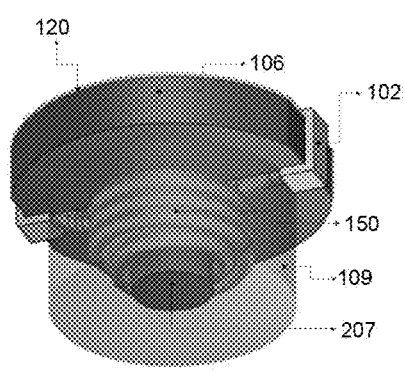

In one embodiment, as shown in FIG. 34C, the magnetic body 101 comprises a T core and a coil wound around the pillar of the T core, wherein the magnetic body 101 comprises a magnetic molding body to encapsulate the pillar of the T core with at least one portion of pillar disposed in the opening of a circuit board 104, wherein a first portion of the first electrode is disposed on the first bottom surface 105 of the first portion 101a of the magnetic body 101, wherein a terminal of the conductive wire forming the coil 150 can be disposed on the first bottom surface 105 and soldered to the first portion of the first electrode, and a second portion of the first electrode 102 is disposed on a first lateral surface 106 of the first portion 101a of the magnetic body 101 and a third portion of the first electrode 102 is disposed on the top surface 120 of the first portion 101a of the magnetic body 101, wherein a soldering material 108 is overlaid on a top surface of the circuit board 104 and extended to the second portion of the first electrode 102 disposed on the first lateral surface 106 of the first portion 101a of the magnetic body 101, wherein the first portion 101a of the magnetic body 101 comprises the base of the T core. In one embodiment, the first electrode is formed by a lead frame.

As shown in FIG. 34A. 34B and FIG. 34C, the magnetic body of the inductor, such as a choke, can comprises a built-in T core, wherein the density of the pillar of the T core can be higher that of an air coil structure to obtain higher magnetic permeability; in addition, the coil wound the pillar of the T core can be positioned firmly to prevent deformation of the coil; and the magnetic material forming the T core can be different from the magnetic material encapsulating the pillar of the T core to obtain better electrical performance.

Although the present invention has been described with reference to the above embodiments, it will be apparent to one of ordinary skill in the art that modifications to the described embodiment may be made without departing from the spirit of the invention. Accordingly, the scope of the invention will be defined by the attached claims, not by the above-detailed descriptions.

What is claimed is:

1. An electronic device, comprising:
    a magnetic body, wherein a coil formed by a conductive wire is disposed in the magnetic body, wherein the magnetic body comprises a first portion and a second portion, wherein the first portion of the magnetic body is located above the second portion of the magnetic body, wherein a first bottom surface of the first portion of the magnetic body and a first side surface of the second portion of the magnetic body forms a first opening under the first bottom surface of the first portion of the magnetic body with at least one portion of the coil being disposed inside the second portion of the magnetic body; and
    a first electrode, wherein at least one portion of the first electrode is disposed on the first bottom surface of the first portion of the magnetic body and electrically connected to a terminal part of the conductive wire, wherein at least one portion of the second portion of the magnetic body is disposed in an opening of a circuit board with the first electrode being disposed on and electrically connected with the circuit board.

2. The electronic device according to claim 1, wherein the electronic device is an inductor.

3. The electronic device according to claim 2, wherein a ratio of the area of the bottom surface of the first electrode to the area of the bottom surface of the second portion of the magnetic body is 1:5.3~32 for allowing the vibration resistance of the inductor being greater than 5G.

4. The electronic device according to claim 2, wherein an insulating layer is disposed on the magnetic body for isolating with the circuit board.

5. The electronic device according to claim 2, wherein the terminal part of the conductive wire forming the coil is extended to the first bottom surface of the first portion of the magnetic body, wherein at least one metal layer is disposed on the terminal part of the conductive wire to form the first electrode.

6. The electronic device according to claim 1, wherein the first side surface and a vertical line forms an angle of 0-10 degree, wherein the minimum distance between the first electrode and the second electrode is greater than the width of the bottom surface of the second portion of the magnetic body.

7. The electronic device according to claim 2, wherein the first side surface of the second portion of the magnetic body has a rectangular shape or a circular shape.

8. The electronic device according to claim 1, wherein said opening of a circuit board is a recess formed on the top surface of the circuit board, wherein the second portion of the magnetic body is disposed in said recess with a bottom surface of the second portion of the magnetic body being above a bottom surface of the circuit board.

9. The electronic device according to claim 1, wherein said opening of a circuit board is a through-hole of the circuit board, wherein the second portion of the magnetic body is disposed in the through-hole of the circuit board with a bottom surface of the second portion of the magnetic body being below a bottom surface of the circuit board.

10. The electronic device according to claim 1, wherein said opening of a circuit board is a through-hole of the circuit board, wherein the second portion of the magnetic body is disposed in said through-hole of the circuit board with a bottom surface of the second portion of the magnetic body being aligned with a bottom surface of the circuit board.

11. The electronic device according to claim 1, wherein a first portion of the first electrode is disposed on the first bottom surface of the first portion of the magnetic body and a second portion of the first electrode is disposed on a first lateral surface of the first portion of the magnetic body, wherein a soldering material is overlaid on a top surface of the circuit board to electrically connect the first electrode to the circuit board, wherein said soldering material is extended to the second portion of the first electrode disposed on the first lateral surface of the first portion of the magnetic body.

12. The electronic device according to claim 1, wherein a first portion of the first electrode is disposed on the first bottom surface of the first portion of the magnetic body, a second portion of the first electrode is disposed on a first lateral surface of the first portion of the magnetic body, and a third portion of the first electrode is disposed on a top surface of the first portion of the magnetic body, wherein a soldering material is overlaid on a top surface of the circuit board to electrically connect the first electrode to the circuit board, wherein said soldering material is extended to the second portion of the first electrode disposed on the first lateral surface of the first portion of the magnetic body.

13. The electronic device according to claim 2, wherein the magnetic body comprises a T core having a base and a pillar disposed on the base, wherein a first portion of the first electrode is disposed on a bottom surface of the base of the T core, a second portion of the first electrode is disposed on a lateral surface of the base of the T core and a third portion of the first electrode is disposed on a top surface of the base of the T core.

14. The electronic device according to claim 2, wherein the bottom surface of the first portion has a rectangular shape or a circular shape.

15. The electronic device according to claim 2, wherein the first electrode is formed by a lead frame.

16. The electronic device according to claim 2, wherein the first electrode is formed by electro-plating.

17. The electronic device according to claim 2, wherein the magnetic body is integrally formed with a unitary body.

18. An inductor, comprising:
a magnetic body and a coil disposed in the magnetic body, wherein the coil is formed by a conductive wire, and the magnetic body comprises a first portion and a second portion, wherein the first portion of the magnetic body is located above the second portion of the magnetic body, wherein a first bottom surface of the first portion of the magnetic body and a first side surface of the second portion of the magnetic body forms a first opening under the first bottom surface of the first portion of the magnetic body with at least one portion of the coil being disposed inside the second portion of the magnetic body; and
a first electrode, wherein a terminal of the conductive wire is electrically connected to the first electrode, and at least one portion of the first electrode is disposed on the first bottom surface of the first portion of the magnetic body, wherein at least one portion of the second portion of the magnetic body is disposed in an opening of a circuit board with the first electrode being disposed on and electrically connected with the circuit board.

19. The inductor according to claim 18, wherein the magnetic body comprises a T core having a base and a pillar disposed on the base, wherein a first portion of the first electrode is disposed on a first bottom surface of the base of the T core, a second portion of the first electrode is disposed on a lateral surface of the base of the T core and a third portion of the first electrode is disposed on a top surface of the base of the T core.

20. The inductor according to claim 18, wherein a ratio of the area of the bottom surface of the first electrode to the area of the bottom surface of the second portion of the magnetic body is 1:5.3~32 for allowing the vibration resistance of the inductor being greater than 5G.

* * * * *